(12) United States Patent
Kittilsland et al.

(10) Patent No.: US 9,051,172 B2
(45) Date of Patent: Jun. 9, 2015

(54) METHOD FOR MANUFACTURING A HERMETICALLY SEALED STRUCTURE

(75) Inventors: Gjermund Kittilsland, Horten (NO); Daniel Lapadatu, Horten (NO); Sissel Jacobsen, Horten (NO); Trond Westgaard, Horten (NO)

(73) Assignee: SensoNor AS (NO)

( * ) Notice: Subject to any disclaimer, the term of this patent is extended or adjusted under 35 U.S.C. 154(b) by 100 days.

(21) Appl. No.: 13/639,423

(22) PCT Filed: Apr. 15, 2011

(86) PCT No.: PCT/EP2011/056054
§ 371 (c)(1),
(2), (4) Date: Feb. 15, 2013

(87) PCT Pub. No.: WO2011/128446
PCT Pub. Date: Oct. 20, 2011

(65) Prior Publication Data
US 2013/0146994 A1    Jun. 13, 2013

(30) Foreign Application Priority Data
Apr. 16, 2010    (EP) .................................. 10160200

(51) Int. Cl.
*B81C 1/00*    (2006.01)
*B81B 7/00*    (2006.01)

(52) U.S. Cl.
CPC ..... *B81C 1/00269* (2013.01); *B81B 2201/0235* (2013.01); *B81B 2201/0242* (2013.01); *B81C2201/019* (2013.01); *B81C 2201/0191* (2013.01); *B81C 2203/0118* (2013.01); *B81C 2203/031* (2013.01); *B81C 2203/058* (2013.01); *B81B 7/0032* (2013.01)

(58) Field of Classification Search
CPC .................. H01L 2924/0002; H01L 2924/00; H01L 23/66; G01L 9/0073; G01L 9/0075; B81C 1/00301; B81C 2203/019; B81C 2203/032; B81C 3/001

USPC .......... 257/E21.499, E21.502, E29.324, 415; 438/51

See application file for complete search history.

(56) References Cited

U.S. PATENT DOCUMENTS

| 4,875,134 A | 10/1989 | Kuisma |
| 2003/0217915 A1* | 11/2003 | Ouellet et al. ........... 204/192.15 |
| 2006/0110893 A1* | 5/2006 | Quenzer et al. ............... 438/455 |
| 2006/0133006 A1* | 6/2006 | Suto et al. .................. 361/283.4 |

FOREIGN PATENT DOCUMENTS

| EP | 1681545 A2 | 7/2006 |
| GB | 2 159 957 A | 12/1985 |
| JP | 2007 064919 A | 3/2007 |

OTHER PUBLICATIONS

International Search Report dated Dec. 1, 2011; International Application No. PCT/EP2011/056054; International Filing Date: Apr. 15, 2011; Applicant: SensoNor Technologies AS.

* cited by examiner

*Primary Examiner* — David Vu
*Assistant Examiner* — Jonathan Han
(74) *Attorney, Agent, or Firm* — Hovey Williams LLP (57) ABSTRACT

A method for providing hermetic sealing within a silicon-insulator composite wafer for manufacturing a hermetically sealed structure, comprising the steps of: patterning a first silicon wafer to have one or more recesses that extend at least partially through the first silicon wafer; filling said recesses with an insulator material able to be anodically bonded to silicon to form a first composite wafer having a plurality of silicon-insulator interfaces and a first contacting surface consisting of insulator material; and using an anodic bonding technique on the first contacting surface and an opposing second contacting surface to create hermetic sealing between the silicon-insulator interfaces, wherein the second contacting surface consists of silicon.

17 Claims, 9 Drawing Sheets

METHOD FOR MANUFACTURING A HERMETICALLY SEALED STRUCTURE

The invention relates to a method for manufacturing a hermetically sealed micro-electromechanical system (MEMS) structure for a high-precision, high-stability MEMS device.

There is a considerable need for high-precision and high-stability MEMS devices, such as angular rate sensors, accelerometers and the like, which are used for a variety of electronic measuring systems. These devices typically contain moving or vibrating components and are generally constructed in metal, quartz or silicon. Silicon-based MEMS devices are preferred because they can be miniaturised and manufactured relatively cheaply in large production runs by batch manufacture.

Composite silicon-insulator wafers, such as the silicon-glass composite wafer described in US 2004/0180517, are often used for the manufacture of MEMS structures because they provide vertical electrical conductors through the wafer.

Creating a composite wafer generally involves a "melt and mould" shaping technique, whereby recesses are etched into a silicon wafer to form a "mould" and an insulator material, typically a dielectric material such as glass, is then melted to fill the recesses. US 2004/0180517 discloses a method for structuring a flat substrate comprising silicon-dielectric composite wafers and EP-A-1436582 discloses a fabrication method for silicon-silicon oxide composite wafers.

The quality of the seal between the silicon-insulator interfaces in the composite wafer in the above-mentioned methods is, however, dependent on the "mechanical fit" of the insulator material against the interface at the silicon recess wall, which does not necessarily provide a hermetic seal. This can pose a risk for gas leaks along the silicon-insulator interface.

The dielectric areas of a silicon-dielectric composite wafer are, in principle, excellent for anodic bonding to silicon wafers to create a hermetic seal. However, when using an anodic bonding process to join a composite wafer to a silicon wafer, it is essential that any contact electrode being attached to the dielectric parts of the composite wafer only contacts dielectric and similarly any contact electrode being attached to silicon parts of the composite wafer only contacts silicon, otherwise a short circuit will occur. This situation is not uncommon because one of the main reasons for using a composite wafer is to provide electrical connections through a wafer. However, it does create a problem in that the anodic bonding process cannot be performed using standard anodic bonding equipment because there is no easy way of aligning standard contacting electrodes of the anodic bonding tooling to the non-uniform wafer pattern without using tailored, device-specific solutions.

U.S. Pat. No. 4,875,134 teaches a method for fabricating a pressure sensor, wherein a hermetic seal is created between silicon-glass interfaces in a composite wafer. However, as explained above, specialist tooling is required for anodic bonding in order to avoid short circuiting due to each bonding surface comprising both silicon and glass.

According to the present invention there is provided a method for providing hermetic sealing within a silicon-insulator composite wafer for manufacturing a hermetically sealed structure, comprising the steps of: patterning a first silicon wafer to have one or more recesses that extend at least partially through the first silicon wafer; filling said recesses with an insulator material able to be anodically bonded to silicon to form a first composite wafer having a plurality of silicon-insulator interfaces and a first contacting surface consisting of insulator material; and using an anodic bonding technique on the first contacting surface and an opposing second contacting surface to create hermetic sealing between the silicon-insulator interfaces, wherein the second contacting surface consists of silicon.

By providing the composite wafer with a silicon-only surface and an insulator-only surface, the silicon-insulator interfaces within the composite wafer can be hermetically sealed by an intermediate anodic bonding step during the process of manufacturing the composite wafer using a standard bonding tool, without needing to specifically align the contacting electrodes. Once the silicon-insulator interfaces have been hermetically sealed, the silicon and insulator surfaces of the composite wafer may be thinned and polished, as required. In existing solutions, the composite wafer is typically formed before the step of anodic bonding, which then requires specially designed tooling to perform the anodic bonding step, to avoid short circuiting.

Advantageously, when performing anodic bonding using the method of the present invention, an electrostatic field is applied across the silicon-insulator interfaces within the composite wafer, which ensures an atomic-level, hermetically-sealed join along the silicon-insulator interfaces to the same level as for the industrially well established wafer level anodic bonding used by the MEMS industry.

The silicon parts of the composite wafer can form vertical through-conductors and fixed electrodes for capacitors, while the recesses filled with insulator material provide electrical isolation between the electrodes.

The anodic bonding is, preferably, performed during wafer bonding of the composite wafer to a structured silicon substrate to create a hermetically sealed join between the composite wafer and the structured silicon substrate at the same time as the hermetic seal is created between the silicon-insulator interfaces within the composite wafer, although this requires proper design and layout of the composite wafer in relation to the silicon substrate in order to ensure correct electrical connections and polarities to each part of the composite wafer and the structured silicon substrate.

Preferably, the planar silicon substrate is structured within the device layer of an SOI wafer, which allows the structured silicon substrate to have very accurate dimensions. Alternatively, the planar silicon substrate is structured within a silicon wafer. Advantageously, with the method of the present invention, the planar silicon substrate can be structured to define a plurality of components arranged to move in a MEMS device, including seismic masses, driving beams, bending spring, pedestals, contacts and capacitor recesses.

Preferably, the present invention provides a method for manufacturing a MEMS structure comprising a structured silicon substrate hermetically sealed between two capping silicon-insulator composite wafers in a vacuum or controlled gas atmosphere, the structured silicon substrate having double-sided excitation means and detection means to provide a device that can achieve considerably better accuracy and stability compared to existing arrangements.

According to the present invention there is also provided a MEMS device manufactured using any of the above-described methods of the present invention. The MEMS device is, preferably, a gyroscope or an accelerometer.

An example of the present invention will now be provided, with reference to the attached figures, in which.

Figure 1:
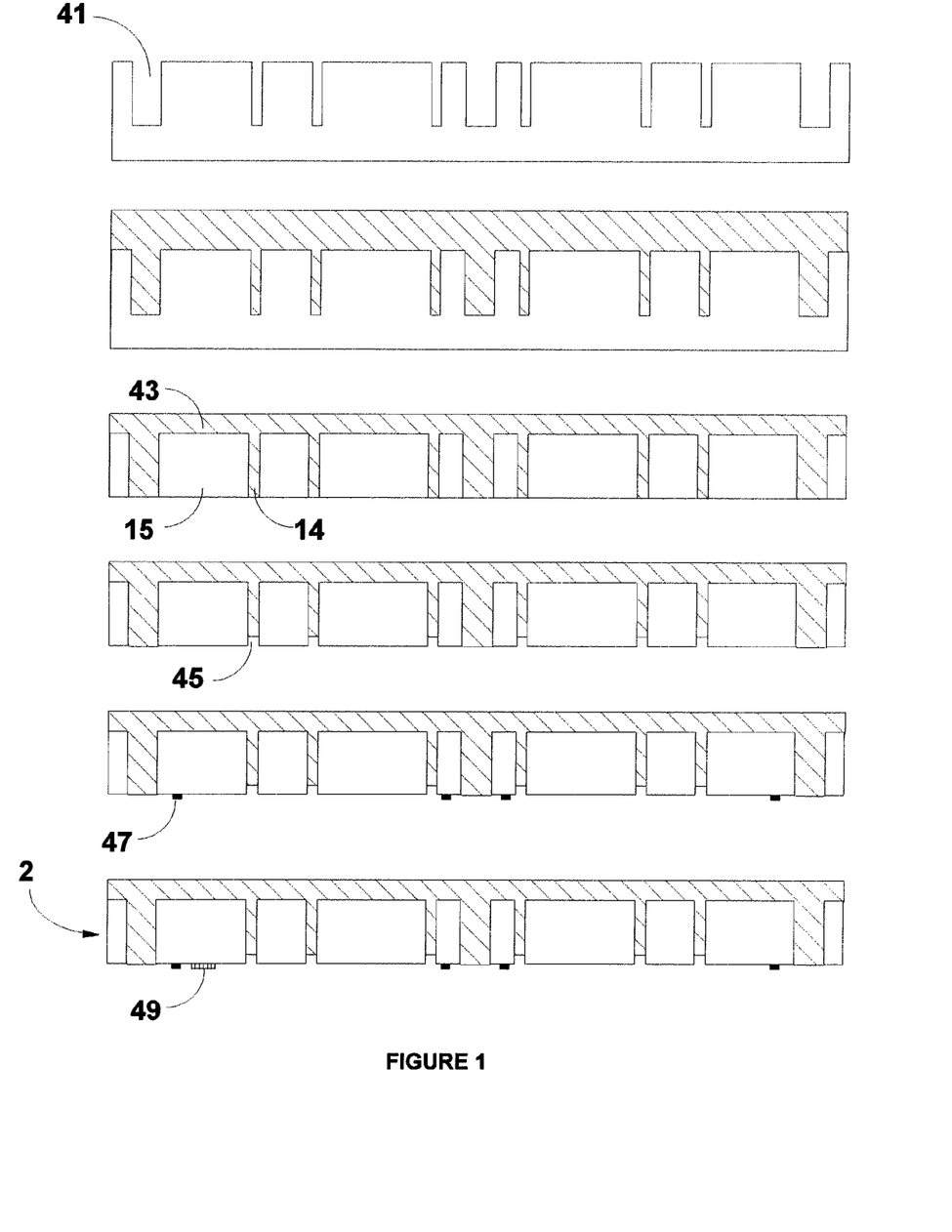
FIG. 1 shows a fabrication sequence for forming a first composite wafer of a sensor structure.
Figure 2:
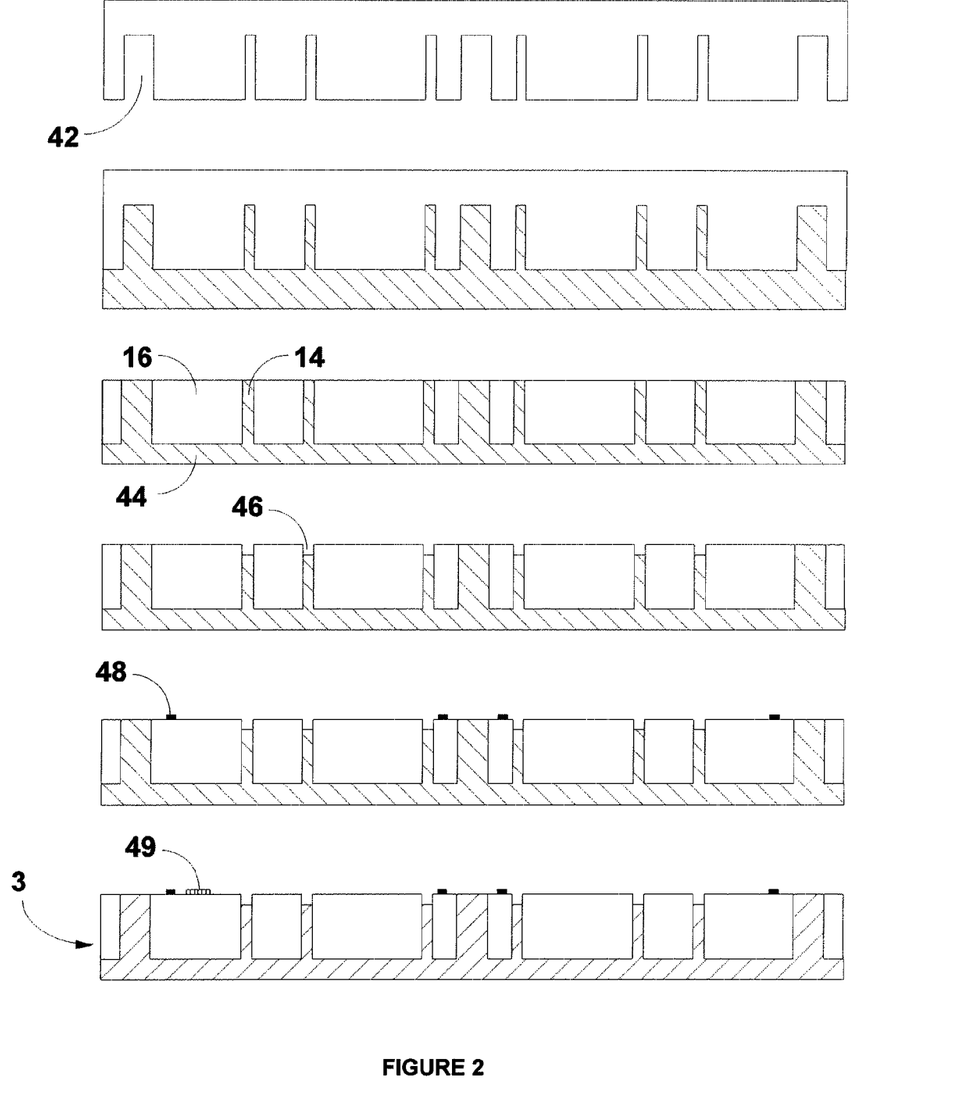
FIG. 2 shows a fabrication sequence for forming a second composite wafer of the sensor structure.

FIGS. 1 and 2 illustrate the fabrication sequence for structuring the first (top) composite wafer 2 and second (bottom) composite wafer 3, respectively. The first processing step consists in defining a pattern of recesses 41, 42 in a silicon wafer, preferably by dry etching, wet etching, or any other suitable methods.

The second processing step consists of providing insulator material in the recesses 41, 42. In this example, the insulator material is a dielectric material, although it will be appreciated that any suitable insulator material may alternatively be used. Hence, the recesses 41, 42 are filled with dielectric material, preferably by reflowing borosilicate glass, to form dielectric inserts 14, which isolate portions of the silicon to form individual silicon parts 15, 16, which may be used as electrodes, feed-throughs, or similar. Sufficient dielectric material is provided to completely cover the surface of the silicon wafer that the recesses 41, 42 were etched into.

The third processing step consists of removal of any excess silicon from a second surface of the composite wafer 2, 3, which opposes the surface consisting of dielectric, to expose the dielectric inserts, by mechanical grinding and chemical-mechanical polishing (CMP), for example. The surface completely covered with a layer of dielectric material can also be thinned and polished if necessary, although a contiguous layer of dielectric 43, 44 needs to be left on this surface to provide a first contacting surface 43, 44 for the anodic bonding electrodes. Alternatively, the contiguous layer of dielectric 43, 44 may be removed and silicon parts 15, 16 may be partially removed, or recessed, such that part of each of the dielectric inserts 14 is exposed. Essentially, the composite wafer 2, 3 should be configured such that, when anodic bonding electrodes are attached, they contact only the dielectric layer 43, 44 or dielectric inserts 14 to prevent any short-circuiting.

To prevent the possibility of subsequent stiction between the moveable parts positioned inside of the final device, the fourth processing step consists of locally etching the dielectric inserts 14 to form shallow recesses 45, 46 on a surface which is to be subsequently bonded, referred to herein as the second bonding surface.

The fifth processing step consists in depositing and patterning portions of a thin metal layer 47, 48, such as titanium or aluminium, on the silicon parts 15, 16 on the second bonding surface of the composite wafer 2, 3. These thin metal layers 47, 48 will eventually form parts of internal electrical contacts, which will be described further on. Depending on the chosen sealing technique, additional thin metal layers may be deposited and patterned to serve as parts of the top side sealing elements.

Ideally, the thin metal layers 47, 48 should also serve as getter for the various gases that may affect in long term the damping of the various motions. Alternatively, a distinct, patterned getter material 49 can be applied to the second bonding surface of either or both first and second composite wafers 2, 3 in addition to the metal layers 47, 48.

It can be seen from the figures that, in this example of the present invention, the corresponding elements of the first and second composite wafers 2, 3 have identical pattern and thickness, thus conferring full symmetry to the final structure, with reference to perpendicular axes.

Figure 3:
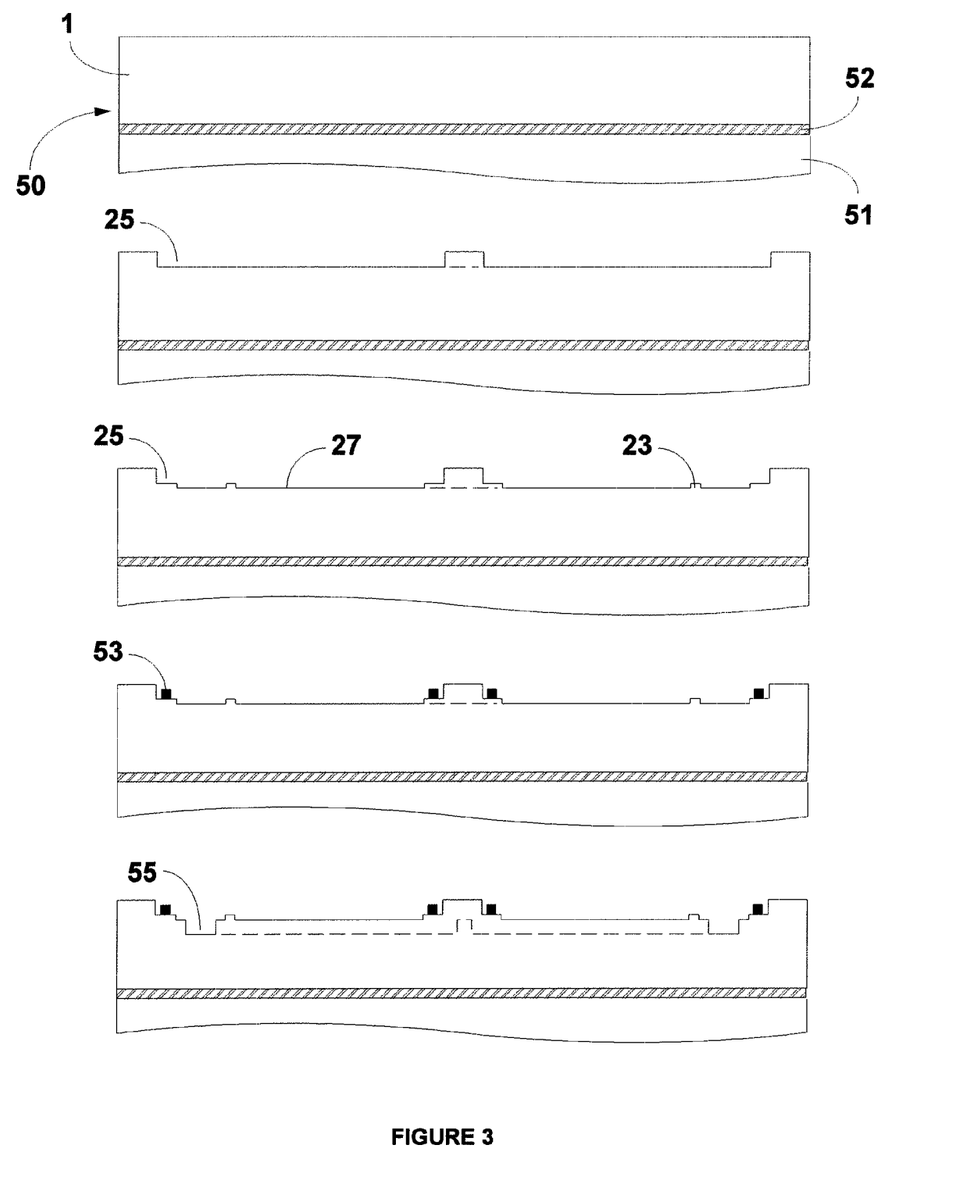
FIG. 3 shows a fabrication sequence to structure the upper surface of a SOI wafer.

FIG. 3 shows a silicon-on-insulator (SOI) wafer 50, consisting of a silicon device layer 1, in which moveable parts of, for example, an angular rate sensor are to be structured, and a handle wafer 51, separated by a buried oxide (insulator) layer 52, which serves as an etch stop layer for a subsequent dry etching step. The fabrication sequence that structures an upper surface of the SOI wafer 50 is typically achieved by patterning the silicon device layer 1, as follows.

The first processing step of the SOI wafer 50 consists in defining a first, shallow, recess 25 within the silicon device layer 1 of the SOI wafer 50, to serve as requisite spacing for top side internal electrical contacts. The second processing step consists in defining a second, deeper, recess 27 within the silicon device layer 1 of the SOI wafer 50, serving as gap for a number of subsequent top side capacitors. The combination of the first recess 25 and second recess 27 enables the creation of silicon stoppers 23, at dedicated locations within the second recess 27, the stoppers 23 being employed to prevent stiction and accidental electrical short-circuiting.

The third processing step consists in depositing and patterning a thin metal layer 53, such as titanium or aluminium, to form a part of the top side internal electrical contacts.

The fourth processing step consists in defining the upper-half profile of the beams by dry etching a third, deeper, recess 55 within the silicon device layer 1 of the SOI wafer 50.

Although in this example of the present invention, the device layer of a SOI wafer is structured to form the moving parts of a MEMS device, such as a gyroscope or accelerometer, these parts could alternatively be structured within a second, preferably mono-crystalline, silicon wafer. However, although using a SOI wafer 50 can be slightly more complex, it is preferred over a mono-crystalline silicon wafer because it allows for better thickness control.

Figure 4:
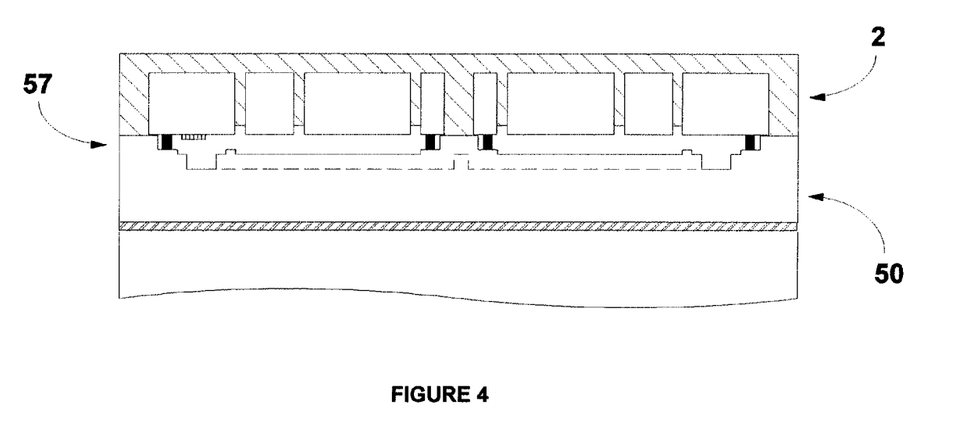
FIG. 4 shows the machined SOI wafer and the first composite wafer sealed by means of anodic bonding to form a double stack wafer.

FIG. 4 illustrates the structured SOI wafer 50 and the first composite wafer 2 brought together to form a double-stack wafer 57, which can be achieved by using anodic bonding to seal a first internal bond interface between the second bonding surface of the composite wafer 2 and the patterned surface of the silicon device layer 1. In the example shown, anodic bonding is performed using the contiguous layer of dielectric material 43 provided on the first composite wafer 2 as the first contacting surface and the handle wafer 51 of the SOI wafer 50 as the second contacting surface.

As described above, however, an alternative would be to remove the contiguous layer of dielectric material 43 and then also partially remove, or recess, silicon parts 15, 16 to expose part of each dielectric insert 14, which would collectively provide the first contacting surface consisting of dielectric material. Furthermore, if a single, silicon wafer was being used instead of an SOI wafer 50, the second contacting surface could be either the surface of the second silicon wafer which opposes the first contacting surface of the first composite wafer, or indeed it could be a side of the second silicon wafer 1 being attached to the first composite wafer 2.

Figure 5:
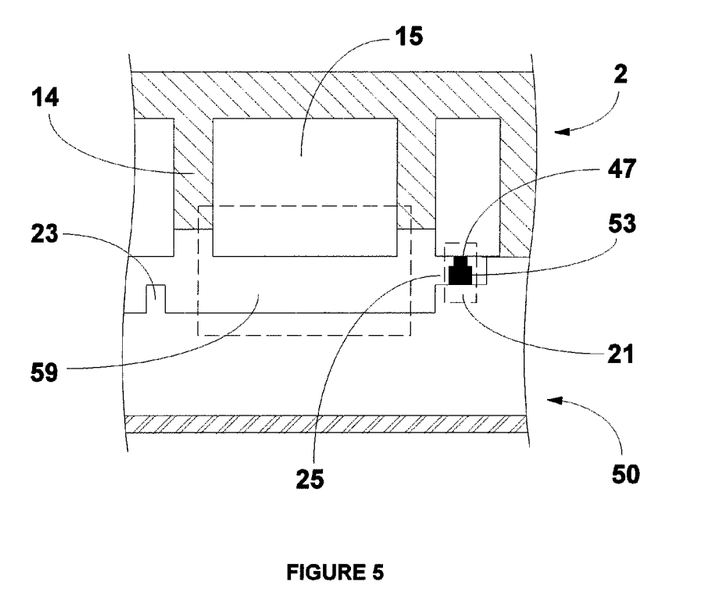
FIG. 5 shows an enlarged partial view of the double-stack wafer of FIG. 4, illustrating an example of a top side capacitor, a top side (internal) electrical contact and a top side stopper.

FIG. 5 shows a detailed view of the double-stack bonded wafer 57 after the first composite wafer 2 and structured SOI wafer 50 have been joined, illustrating an example of a top side capacitor 59, a top side internal electrical contact 21 and a top side stopper 23. The internal electrical contact 21 is formed by the thin metal layer 47 provided on the first composite wafer 2 and the thin metal layer 53 provided on the structured SOI wafer 50 being squeezed together during the joining process. To achieve a reliable internal electrical contact, the depth of the first recess 25 and the thickness of the metal layers 47 and 53 must be chosen with care and optimised to take into account the effect of the processing tolerances.

Figure 6:
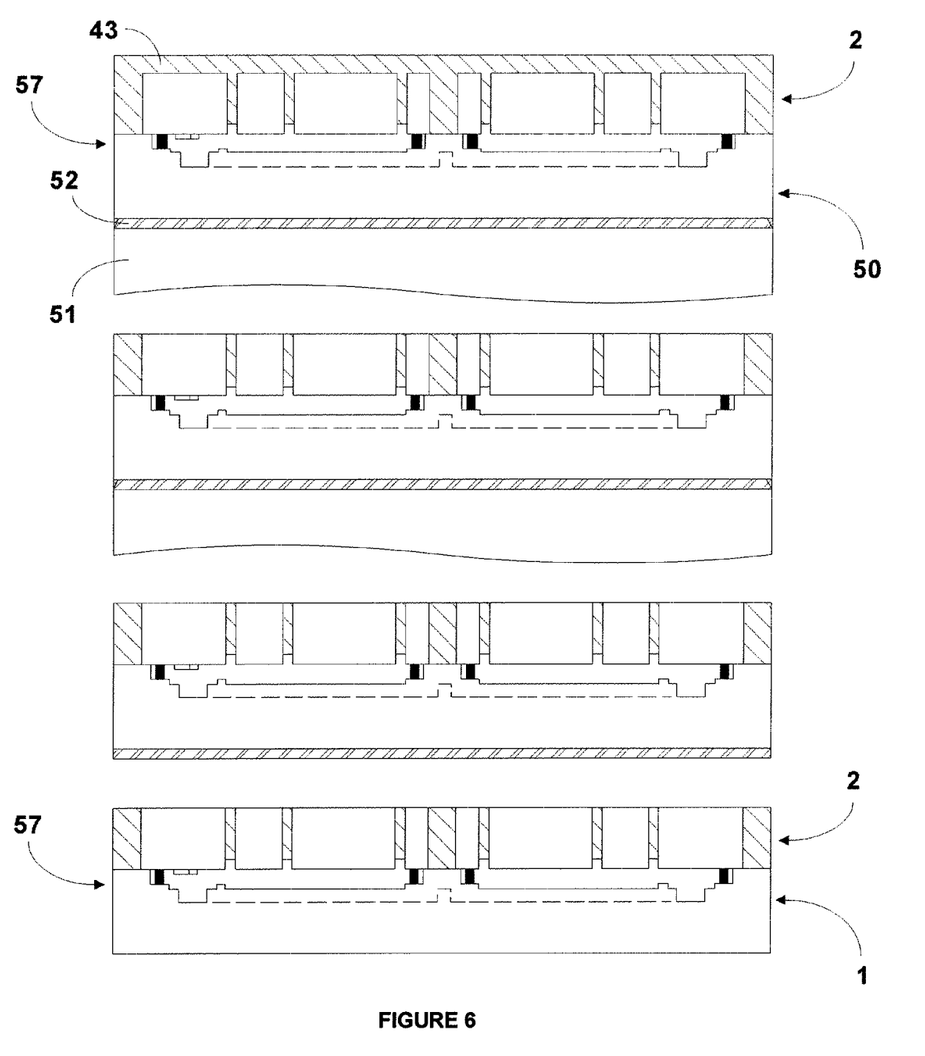
FIG. 6 shows a fabrication sequence that removes excess materials from the double-stack wafer.

FIG. 6 illustrates the next step of the fabrication sequence that removes the excess materials from the double-stack bonded wafer 57 once bonding has taken place. For example, grinding, followed by CMP, can be used to remove the contiguous layer of dielectric 43, which acted as the first contacting surface for the previous anodic bonding sealing step, thus exposing the silicon pattern of the composite wafer 2. Alternatively, the contiguous layer of dielectric 43 may be left on the first composite wafer 2.

The handle layer 51 of the SOI wafer 50 can also be removed by grinding, for example, followed by reactive ion etching with etch stop on the buried oxide layer 52, with etching being used to remove the buried oxide layer 52 to expose the lower surface of the released silicon device layer 1. An alternative option, but which is more expensive and time consuming, would be to remove the handle wafer 51 by etching only, with etch stop on the buried oxide layer 52.

Figure 7:
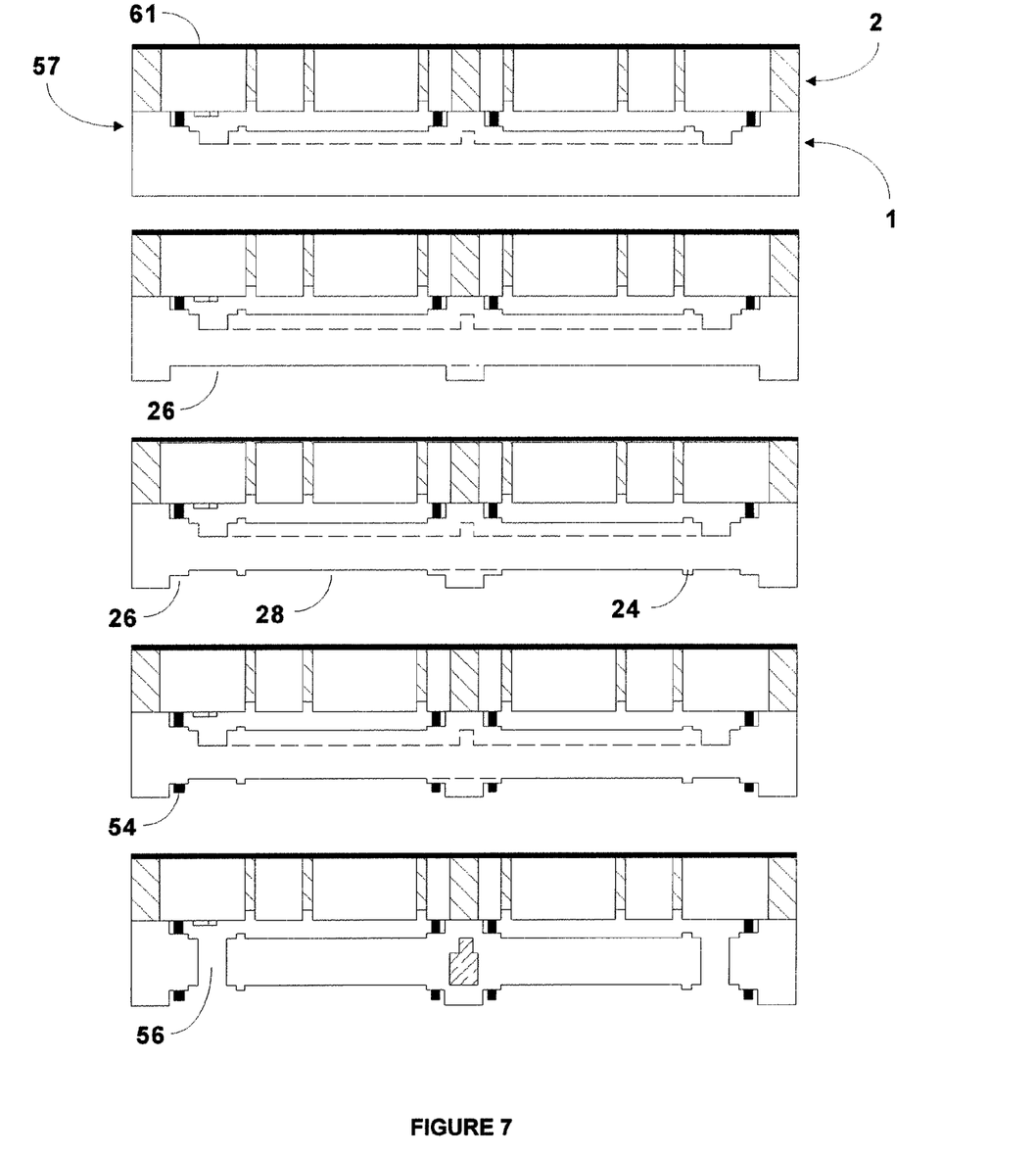
FIG. 7 shows a fabrication sequence to structure the lower surface of the double-stack wafer.

FIG. 7 illustrates the fabrication sequence that structures the lower surface of the silicon device layer 1. In this example, a protective metal layer 61, such as aluminium, is shown deposited on the upper surface of the double-stack wafer 57 before the first processing step. The protective metal layer 61 is, however, optional at this stage and is sometimes used to enhance the gripping force holding the wafer to electrostatic chucks during subsequent processing.

The first processing step of the double-stack bonded wafer 57 consists in defining a first, shallow recess 26 serving as requisite spacing for bottom side internal electrical contacts, explained further on.

The second processing step consists in defining a second, deeper recess 28 to serve as a capacitance gap for a number of subsequent bottom side capacitors.

In this example, the first and second recesses 26, 28 provided on the lower surface of the silicon device layer 1 have the same pattern and depth as the first and second recesses 25, 27 formed previously on an upper surface of the silicon device layer 1, such that the two surfaces are substantially symmetrical.

The combination of first, shallow recess 26 and second, deeper recess 28 enables the creation of bottom side silicon stoppers 24, at dedicated locations within the second recess 28, the stoppers 23 being employed to prevent stiction and accidental electrical short-circuiting.

The third processing step consists in depositing and patterning a thin metal layer 54, such as titanium or aluminium, to form a part of bottom side internal electrical contacts. The metal layer 54 on the back surface of the silicon device layer 1 preferably has the same composition, pattern and thickness as the metal layer 53 on the upper surface of the silicon device layer 1.

The fourth processing step, in this example, consists of releasing a portion of the silicon device layer 1 forming the masses and beams by deep reactive ion etching 56 to provide a double-sided sensor upon which excitation and detection means may be symmetrically arranged.

Figure 8:
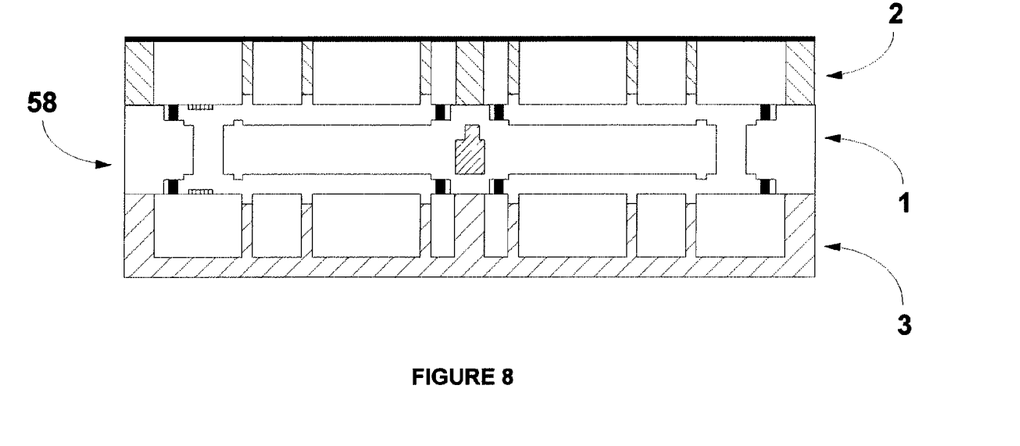
FIG. 8 shows the machined double-stack wafer and second composite wafer sealed by means of anodic bonding to form a triple stack wafer.

FIG. 8 shows the double-stack bonded wafer 57 and the second composite wafer 3 sealed together to form a triple-stack bonded wafer 58, which can be achieved using anodic bonding to seal a second internal bond interface between the second bonding surface of the second composite wafer 3 and the silicon device layer 1 of the SOI wafer 50. As will be understood from the preceding description, a preferably, contiguous conductive layer is required to provide a first contacting surface on the first and/or second composite wafer 2, 3 for securing a bonding electrode during subsequent anodic bonding. If the contiguous layer of dielectric 43 is left on the double-stack bonded wafer, this can be used as the first contacting surface.

Alternatively, a, preferably, contiguous metal layer 61 may be deposited on the wafer, as shown in this example of the present invention, wherein anodic bonding is achieved using the first contacting surface provided on the first composite wafer 2 as described above, and the contiguous layer of dielectric 44 provided on the second composite wafer 3 as the second contacting surface. Alternatively, the contiguous layer of dielectric material 44 may be removed from the second composite wafer 3, similar to as described above for the first composite wafer 2, and the silicon parts 16 may be partially removed, or recessed, to expose part of each dielectric insert 14, which would collectively provide the second contacting surface.

Furthermore, it will be recognised that, in the event that the silicon device layer 1 is a continuous piece of silicon that extends the width of the composite wafer 2, 3, a bonding electrode may be attached to a side of the silicon device layer 1 acting as the first contacting surface instead of the first contacting surface being provided on the first composite wafer 2, with the second contacting surface being provided on the second composite wafer 3.

Figure 9:
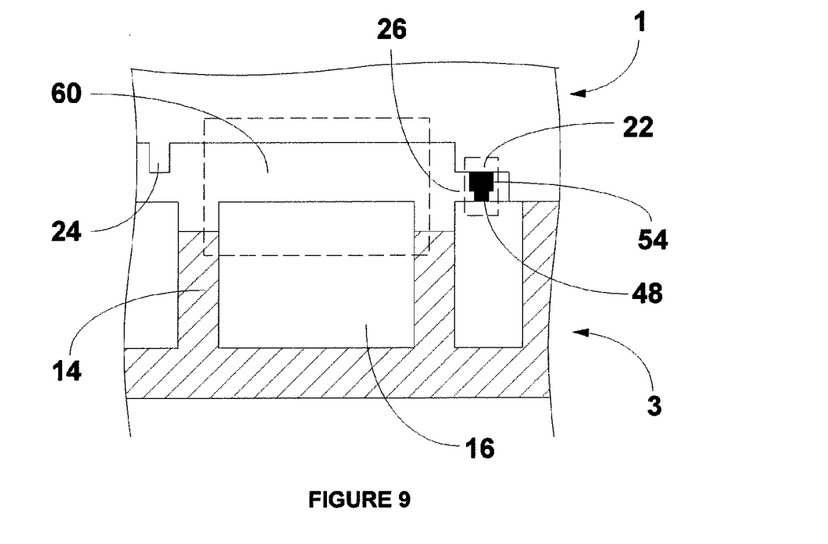
FIG. 9 shows an enlarged partial view of the triple-stack wafer of FIG. 8, illustrating an example of a bottom side capacitor, a bottom side (internal) electrical contact and a bottom side stopper.

FIG. 9 shows a detailed view of the triple-stack bonded wafer 58 after the double-stack bonded wafer 57 and second composite wafer 3 have been joined together, illustrating an example of a bottom side capacitor 60, a bottom side internal electrical contact 22 and a bottom side stopper 24. As with the top side electrical contact 21, the bottom side internal electrical contact 22 is formed by the thin metal layer 48 provided on the second composite wafer 3 and the thin metal layer 54 provided on the silicon device layer 1 being squeezed together during the joining process. To achieve a reliable internal electrical contact, the depth of the lower side shallow recess 26 and the thickness of the metal layers 48 and 54 must be chosen with care and optimised to take into account the effect of the processing tolerances.

Figure 10:
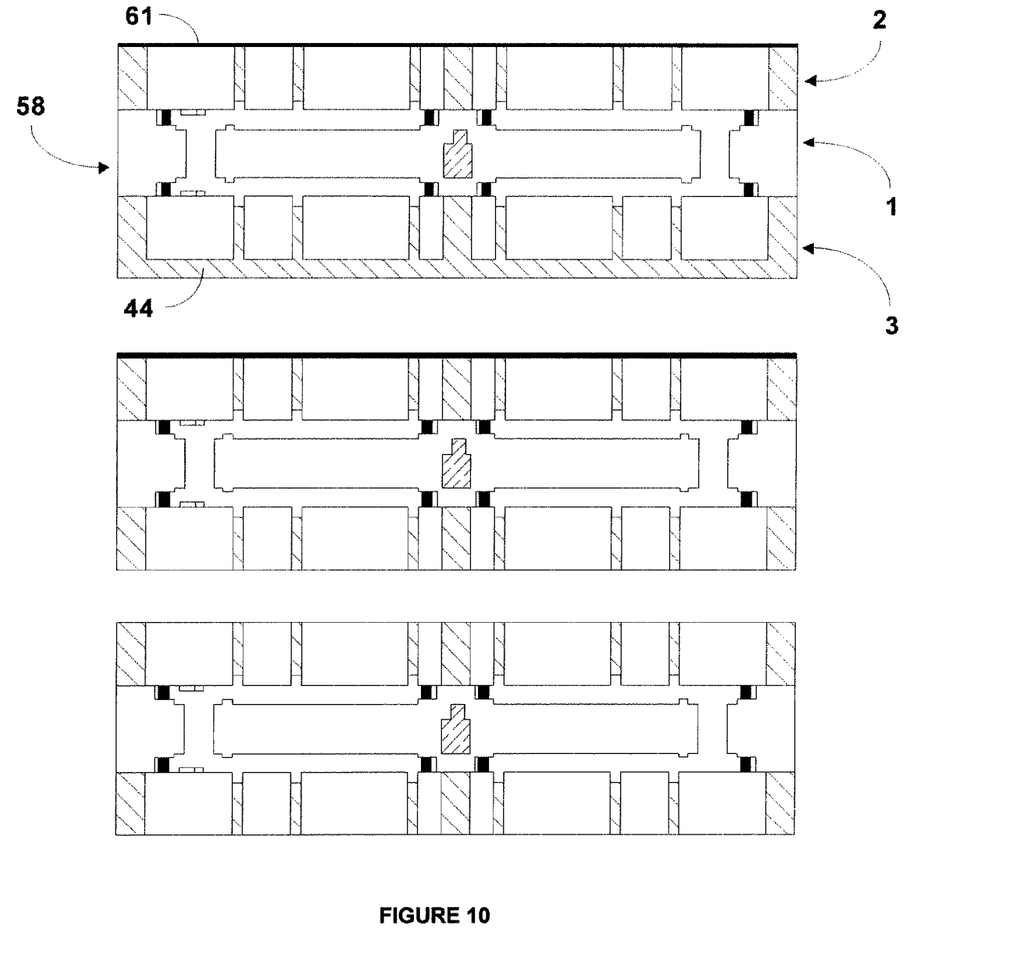
FIG. 10 shows a fabrication sequence that removes excess materials from the triple-stack wafer.

FIG. 10 illustrates the next step of the fabrication sequence that removes the excess materials from the triple-stack bonded wafer 58. For instance, grinding, followed by CMP, can be used to remove the contiguous layer of dielectric 44, which was required in combination with the previous anodic bonding sealing technique, thus exposing the silicon pattern of the composite wafer 3. Dry etching, wet etching, or any other suitable method can be used to remove the protective metal layer 61, if present.

Figure 11:
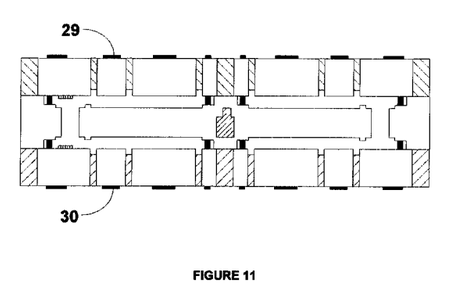
FIG. 11 shows a fabrication sequence that creates external metallisation on the triple-stack wafer.

FIG. 11 illustrates the fabrication sequence that creates the external metallisation on the triple-stack bonded wafer 58. Metal layers, suitable for forming an electrical contact, are deposited and subsequently patterned on the upper and lower outer surfaces of the triple-stack bonded wafer 58, to form the top side pads 29 and bottom side pads 30. Patterns in the same metal layers allow direct electrical connection between the pads and the corresponding silicon 15, 16 of the composite wafers 2, 3. A suitable singulation method can then be used to separate the individual chips.

Although other suitable bonding processes, such as, for example, direct bonding, eutectic bonding, plasma activated and thermo-compression bonding may be used to join the composite wafer to the structured silicon substrate, only anodic bonding creates a hermetic seal at the silicon-dielectric interface in the composite wafer. With other bonding methods, the hermeticity inherent between the silicon-dielectric interfaces in the composite wafer will depend solely on the "mechanical fit" provided by the "melt and mould" procedure.

Furthermore, getter material may be applied to any surface inside the sealed cavity that is formed by the method of the present invention. For example, getter material may be applied to the first and/or second internal bonding surfaces of the second silicon wafer and/or the second bonding surface of either or both the first and second composite wafers 2, 3.

In the above-described example of the present invention, the MEMS structure comprises both a first composite wafer 2 and a second composite wafer 3. A skilled person will, of course, recognise that a MEMS structure having any number of composite wafers may be produced using the method of the present invention. For example, if only a single composite wafer is used then the lower surface of the silicon wafer 1 may not need to be processed as described in the above example.

The invention claimed is:

1. A method for providing hermetic sealing within a silicon-insulator composite wafer for manufacturing a hermetically sealed structure, comprising the steps of:
    patterning a first silicon wafer to have one or more recesses that extend from a surface of the first silicon wafer at least partially through the first silicon wafer;
    filling said recesses and contiguously covering said surface with an insulator material able to be anodically bonded to silicon to form a first composite wafer having a plurality of silicon-insulator interfaces formed by said insulator material in said filled recesses and a first contacting surface formed by said insulator material contiguously covering said surface; and
    using an anodic bonding technique on the first contacting surface and a second contacting surface to create hermetic sealing between the silicon-insulator interfaces of the first composite wafer, wherein the second contacting surface consists of silicon.

2. The method of claim 1, wherein the second contacting surface is provided on the first silicon wafer.

3. The method of claim 2, further comprising the step of removing the first and second contacting surfaces after using the anodic bonding technique.

4. The method of claim 1, further comprising, before said step of using an anodic bonding technique, the steps of:
    removing any excess silicon on a second bonding surface of the first composite wafer, which second bonding surface opposes the first contacting surface, such that said insulator filled recesses extend completely through the first composite wafer;
    patterning a second silicon wafer to form a first internal bonding surface; and
    bringing the first internal bonding surface of the second silicon wafer together with the second bonding surface of the first composite wafer to form a first internal bond interface,
    wherein the opposing second contact surface for the anodic bonding technique is provided on the second silicon wafer.

5. The method of claim 4, wherein the design and layout of the first composite wafer in relation to the second silicon wafer are such that at least one of the silicon-insulator interfaces are hermetically sealed by the anodic bonding technique.

6. The method of claim 5, further comprising the step of removing the first contacting surface from the first composite wafer after using the anodic bonding technique.

7. The method of claim 6, further comprising the step of providing a metal layer on the surface of the first composite wafer.

8. The method of claim 7, further comprising the steps of:
    patterning a lower surface of the second silicon wafer, to form a second internal bonding surface; and
    etching the second silicon wafer to define a structured silicon substrate.

9. The method of claim 8, further comprising the steps of:
    using a third silicon wafer to prepare a second composite wafer similar to the first composite wafer of claim 1;
    removing any excess silicon on a second bonding surface of the second composite wafer, which second bonding surface opposes the first contacting surface of the second composite wafer, such that one or more of said insulator filled recesses of said second composite wafer extend completely through said second composite wafer;
    bringing the second internal bonding surface of the second silicon wafer together with the second bonding surface of the second composite wafer to form a second internal bond interface; and
    using a further anodic bonding technique on the first contacting surface of the second composite wafer and a second contacting surface to create hermetic sealing between the silicon-insulator interfaces in the second composite wafer.

10. The method of claim 9, wherein the second contacting surface is the first contacting surface of the first composite wafer.

11. The method of claim 10, further comprising the step of removing the first contacting surface from the first composite wafer and/or second composite wafer after using the anodic bonding technique.

12. The method of claim 11, further comprising, before using an anodic bonding technique on the first or second composite wafer, the step of; providing corresponding portions of metal layer on the second surface(s) of the first and/or second wafer(s) for providing internal electrical contacts.

13. The method of claim 12, wherein the portions of metal layer are also arranged to serve as a getter.

14. The method of claim 13, further comprising the step of providing a getter material on the second surface(s) of the first and/or second composite wafer(s) and/or a surface of the second silicon wafer.

15. The method of claim 4, further comprising the step of:
    providing portions of metal layers on the outer surfaces of the or each composite wafer to form connecting pads, the portions of metal layers being arranged to allow direct electrical connection to the silicon parts of the composite wafers, which are isolated by the dielectric filled recesses.

16. The method of claim 4, wherein:
    the second silicon wafer is a silicon-on-insulator wafer (SOI) or its device layer; and
    the handle layer of the SOI wafer is the second contacting surface for the step of using an anodic bonding technique when the first internal bonding surface of the second silicon wafer is brought together with the second bonding surface of the first composite wafer.

17. The method of claim 16, wherein the dielectric material is glass or silicon-dioxide.

* * * * *